US009349673B2

(12) United States Patent
Yoda

(10) Patent No.: US 9,349,673 B2
(45) Date of Patent: May 24, 2016

(54) SUBSTRATE, METHOD OF MANUFACTURING SUBSTRATE, SEMICONDUCTOR DEVICE, AND ELECTRONIC APPARATUS

(71) Applicant: Seiko Epson Corporation, Tokyo (JP)

(72) Inventor: Tsuyoshi Yoda, Matsumoto (JP)

(73) Assignee: Seiko Epson Corporation (JP)

( * ) Notice: Subject to any disclaimer, the term of this patent is extended or adjusted under 35 U.S.C. 154(b) by 226 days.

(21) Appl. No.: 13/929,218

(22) Filed: Jun. 27, 2013

(65) Prior Publication Data

US 2014/0008816 A1 Jan. 9, 2014

(30) Foreign Application Priority Data

Jul. 4, 2012 (JP) ................. 2012-150345

(51) Int. Cl.
    H01L 23/48 (2006.01)
    H01L 21/768 (2006.01)
    H05K 1/02 (2006.01)

(52) U.S. Cl.
    CPC ........ H01L 23/481 (2013.01); H01L 21/76804 (2013.01); H01L 21/76898 (2013.01); H01L 2224/0401 (2013.01); H01L 2224/0557 (2013.01); H01L 2224/05572 (2013.01); H01L 2224/13009 (2013.01); H01L 2924/00014 (2013.01); H05K 1/024 (2013.01)

(58) Field of Classification Search
    CPC .............................................. H01L 23/53295
    See application file for complete search history.

(56) References Cited

U.S. PATENT DOCUMENTS

| 5,940,732 | A | 8/1999 | Zhang | |
|---|---|---|---|---|
| 7,141,493 | B2 | 11/2006 | Masuda | |
| 7,256,497 | B2 | 8/2007 | Kameyama et al. | |
| 7,582,971 | B2 | 9/2009 | Kameyama et al. | |
| 7,646,100 | B2 | 1/2010 | Kameyama et al. | |
| 7,759,247 | B2 | 7/2010 | Kameyama et al. | |
| 7,786,553 | B1 | 8/2010 | Zhang | |
| 8,115,317 | B2 | 2/2012 | Yamada et al. | |
| 2005/0287722 | A1 | 12/2005 | Zhang | |
| 2010/0225004 | A1* | 9/2010 | Igarashi | 257/774 |
| 2011/0001192 | A1 | 1/2011 | Zhang | |
| 2011/0271757 | A1 | 11/2011 | Yoda | |
| 2011/0297930 | A1 | 12/2011 | Choi et al. | |
| 2012/0168880 | A1 | 7/2012 | Zhang | |

FOREIGN PATENT DOCUMENTS

| JP | 2004-296893 | 10/2004 |
|---|---|---|
| JP | 2004-311949 | 11/2004 |
| JP | 2005-123325 | 5/2005 |

(Continued)

*Primary Examiner* — William Harriston
(74) *Attorney, Agent, or Firm* — Harness, Dickey & Pierce, P.L.C.

(57) ABSTRACT

A substrate includes a first insulating layer provided on a base board, a second insulating layer provided on the first insulating layer, a third insulating layer provided on the second insulating layer, a pad electrode provided on the third insulating layer, and a hole formed to penetrate the substrate and reaching the pad electrode. A diameter of the hole in the first insulating layer is larger than a diameter of the hole in the second insulating layer, and the first insulating layer and the second insulating layer are formed using different materials from each other and the second insulating layer and the third insulating layer are formed using different materials from each other.

2 Claims, 6 Drawing Sheets

(56) References Cited

FOREIGN PATENT DOCUMENTS

| JP | 2005-235860 | 9/2005 |
| JP | 2006-128271 | 5/2006 |
| JP | 2006-128272 | 5/2006 |
| JP | 2006-128352 | 5/2006 |
| JP | 2006-128353 | 5/2006 |
| JP | 2007-053149 | 3/2007 |
| JP | 2009-295676 | 12/2009 |
| JP | 2010-263130 | 11/2010 |
| JP | 2011-238674 | 11/2011 |
| JP | 2011-238956 A | 11/2011 |
| JP | 2011-258949 A | 12/2011 |

\* cited by examiner

SUBSTRATE, METHOD OF MANUFACTURING SUBSTRATE, SEMICONDUCTOR DEVICE, AND ELECTRONIC APPARATUS

BACKGROUND

1. Technical Field

The present invention relates to a substrate, a method of manufacturing the substrate, a semiconductor device having the substrate, and an electronic apparatus having the semiconductor device.

2. Related Art

Recently, portable electronic apparatuses have become widespread, and an advanced circuit arrangement in which a plurality of semiconductor devices are mounted has been often used in the portable electronic apparatuses with the higher functionality. Further, for the portable electronic apparatuses, reduction in size and weight has been also required. Accordingly, a manufacturing method that realizes downsizing of the semiconductor device while forming a plurality of penetrating electrodes called TSV (Through Silicon Via) on a semiconductor substrate for higher density with the smaller distances between the penetrating electrodes has been proposed.

In the semiconductor device, electrical and mechanical reliability of the penetrating electrodes formed on the semiconductor substrate is required, and, in related art, there has been a semiconductor device with improved reliability having three-layered interlayer insulating films with interlayer film through holes formed between the semiconductor substrate and an electrode pad and the side walls of the interlayer film through holes in three-step shapes.

JP-A-2010-263130 is an example of related art.

However, when the three-layered interlayer insulating films are formed using the same material, formation of the step shapes using the existing method such as dry etching is difficult, and more complex process is necessary and causes deterioration in yield and reliability.

SUMMARY

An advantage of some aspects of the invention is to provide a substrate with improved reliability in electrical and mechanical connections, a method of manufacturing the substrate, a semiconductor device having the substrate, and an electronic apparatus having the semiconductor device.

The invention can be implemented as the following application examples.

Application Example 1

This application example is directed to a substrate including a base substrate, a first insulating layer provided on a first surface of the base substrate, a second insulating layer provided on the first insulating layer, a third insulating layer provided on the second insulating layer, a pad electrode provided on the third insulating layer, a hole formed to penetrate the base substrate, the first insulating layer, the second insulating layer, and the third insulating layer and reaching the pad electrode from a second surface opposite to the first surface of the base substrate, a fourth insulating layer covering the base substrate, the first insulating layer, the second insulating layer, and the third insulating layer in the hole, and a conductor connected to the pad electrode and covered by the fourth insulating layer, wherein a diameter of the hole in the first insulating layer is larger than a diameter of the hole in the second insulating layer, and the first insulating layer and the second insulating layer are formed using different materials from each other and the second insulating layer and the third insulating layer are formed using different materials from each other.

According to the configuration, for example, when the first insulating layer and the second insulating layer are penetrated by dry etching, the second insulating layer is formed using a material having a slower etching rate than that of the first insulating layer, and the opening of the second insulating layer may be made smaller than that of the first insulating layer. Accordingly, thereby, the substrate in which the bonding areas between the first insulating layer and the second insulating layer and the fourth insulating layer may be increased and the mechanical strength of the entire penetrating electrode may be kept is obtained.

Application Example 2

This application example is directed to the substrate of the application example described above, wherein the diameter of the hole in the second insulating layer is larger than a diameter of the hole in the third insulating layer.

According to the configuration, the part of the fourth insulating layer stacked on the first insulating layer and the second insulating layer and the part stacked on the second insulating layer and the third insulating layer are formed in an L-shape near the first insulating layer and the second insulating layer and near the second insulating layer and the third insulating layer. Thereby, the substrate in which the bonding areas between the first insulating layer, the second insulating layer, and the third insulating layer and the fourth insulating layer may be increased and the mechanical strength of the entire penetrating electrode may be kept is obtained.

Application Example 3

This application example is directed to the substrate of the application example described above, wherein a part of the second insulating layer covered by the fourth insulating layer has a thickness thinner toward a center of the hole.

According to the configuration, the bonding area between the second insulating layer and the fourth insulating layer may be increased to improve the bonding strength. Further, the part of the second insulating layer covered by the fourth insulating layer is formed to be thinner, and thus, stress on the contact part between the pad electrode and the conductor due to the difference in thermal expansion and contraction between the second insulating layer and the conductor when thermal stress is applied may be reduced.

Application Example 4

This application example is directed to the substrate of the application example described above, wherein a part of the third insulating layer covered by the fourth insulating layer has a thickness thinner toward a center of the hole.

According to the configuration, the bonding areas between the second insulating layer and the third insulating layer and the fourth insulating layer may be increased to improve the bonding strength. Further, the parts of the second insulating layer and the third insulating layer covered by the fourth insulating layer are formed to be thinner, and thus, stress on the contact part between the pad electrode and the conductor due to the difference in thermal expansion and contraction between the second insulating layer and the third insulating layer and the conductor when thermal stress is applied may be reduced.

Application Example 5

This application example is directed to a semiconductor device including the substrate according to Application Example 1, an circuit element formed on the first surface side of the base substrate, and a redistribution layer connected to the conductor and formed on the second surface side of the base substrate.

According to the configuration, the semiconductor device using the penetrating electrode with electrical and mechanical reliability is obtained.

Application Example 6

This application example is directed to an electronic apparatus including the semiconductor device according to Application Example 5.

According to the configuration, a circuit arrangement using the penetrating electrode with electrical and mechanical reliability is obtained.

Application Example 7

This application example is directed to a method of manufacturing a substrate including forming a first insulating layer on a first surface of a base substrate, forming a second insulating layer on the first insulating layer using a material different from that of the first insulating layer, forming a third insulating layer on the second insulating layer using a material different from that of the second insulating layer, forming a pad electrode on the third insulating layer, forming a hole penetrating the base substrate, the first insulating layer, the second insulating layer, and the third insulating layer and reaching the pad electrode from a second surface opposite to the first surface of the base substrate, forming a fourth insulating layer covering the base substrate, the first insulating layer, the second insulating layer, and the third insulating layer in the hole, and forming a conductor connecting to the pad electrode in a region of the hole covered by the fourth insulating layer, wherein the forming of the hole includes forming a diameter of the hole in the first insulating layer to be larger than a diameter of the hole in the second insulating layer.

According to the method, for example, when the first insulating layer and the second insulating layer are penetrated by dry etching, the second insulating layer is formed using a material having a slower etching rate than that of the first insulating layer, and the opening of the second insulating layer may be made smaller than that of the first insulating layer. Accordingly, thereby, the penetrating electrode in which the bonding areas between the first insulating layer and the second insulating layer and the fourth insulating layer may be increased and the mechanical strength of the entire penetrating electrode may be kept is obtained.

Application Example 8

This application example is directed to the method of the application example described above, wherein the forming of the hole includes forming the diameter of the hole in the second insulating layer to be larger than a diameter of the hole in the third insulating layer.

According to the method, the part of the fourth insulating layer stacked on the first insulating layer and the second insulating layer and the part stacked on the second insulating layer and the third insulating layer are formed to edge with the inner circumferences of the through holes of the first insulating layer and the second insulating layer. That is, when the multilayered structure is seen from the section direction, the structure is formed in an L-shape near the first insulating layer and the second insulating layer, and further, the structure is also formed in an L-shape near the second insulating layer and the third insulating layer. Thereby, the bonding areas between the first insulating layer, the second insulating layer, and the third insulating layer and the fourth insulating layer may be increased and the mechanical strength of the entire penetrating electrode may be kept.

Application Example 9

This application example is directed to the method of the application example described above, wherein the forming of the hole includes removing the first insulating layer, the second insulating layer, and the third insulating layer by dry etching.

According to the method, etching of the first insulating layer, the second insulating layer, and the third insulating layer underneath the through hole of the base substrate is started from the center of the through hole of the base substrate, and thus, the through holes of the first insulating layer, the second insulating layer, and the third insulating layer are at equal distances from the through hole of the base substrate.

Application Example 10

This application example is directed to the method of the application example described above, wherein the forming of the second insulating layer includes forming the second insulating layer using a material having a different dry etching rate from that of the first insulating layer.

According to the method, for example, when the first insulating layer and the second insulating layer are penetrated by dry etching, the second insulating layer is formed using a material having a slower etching rate than that of the first insulating layer, and the opening of the second insulating layer may be made smaller than that of the first insulating layer. Accordingly, thereby, the penetrating electrode in which the bonding areas between the first insulating layer and the second insulating layer and the fourth insulating layer may be increased and the mechanical strength of the entire penetrating electrode may be kept is obtained.

Application Example 11

This application example is directed to the method of the application example described above, wherein the forming of the third insulating layer includes forming the third insulating layer using a material having a different dry etching rate from that of the second insulating layer.

According to the method, the bonding area between the second insulating layer and the fourth insulating layer may be increased to improve the bonding strength. Further, the through hole part of the second insulating layer is formed to be thinner, and thus, stress on the contact part between the pad electrode and the conductor due to the difference in thermal expansion and contraction between the second insulating layer and the conductor when thermal stress is applied may be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
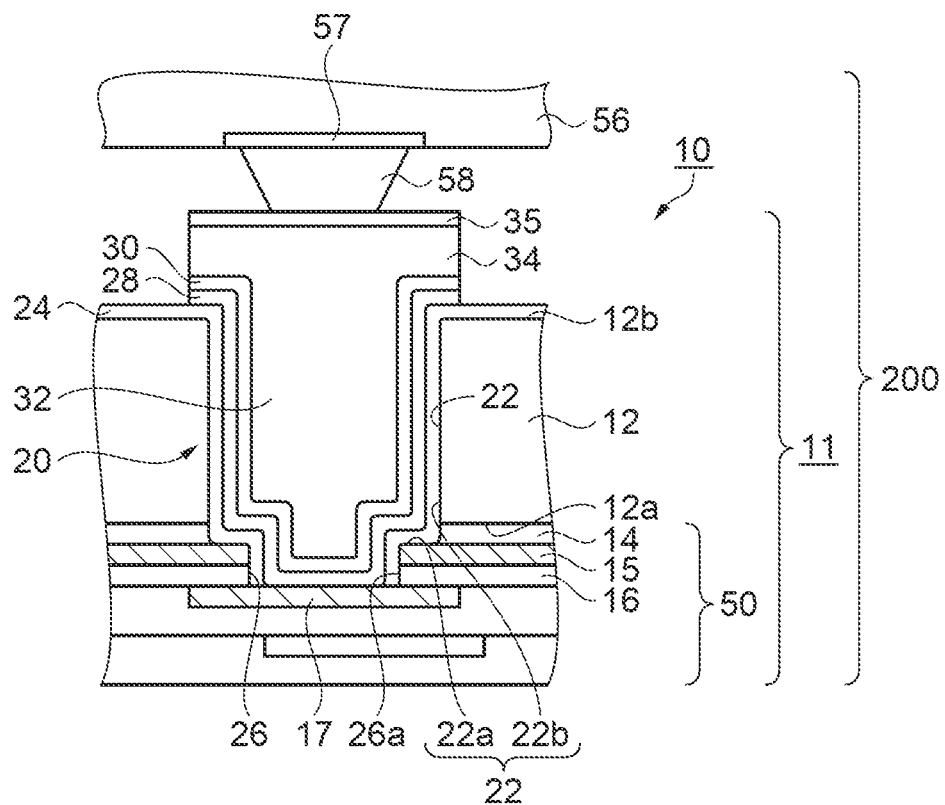
FIGS. 1A and 1B are schematic views of a semiconductor device having a penetrating electrode of an embodiment.

As below, the invention will be explained in detail using embodiments shown in the drawings. Note that the component elements, types, combinations, shapes, and their relative arrangements described in the embodiments are just explanatory examples not for limiting the range of the invention to those only unless there is any specific description.

Embodiment 1

Figure 1B:
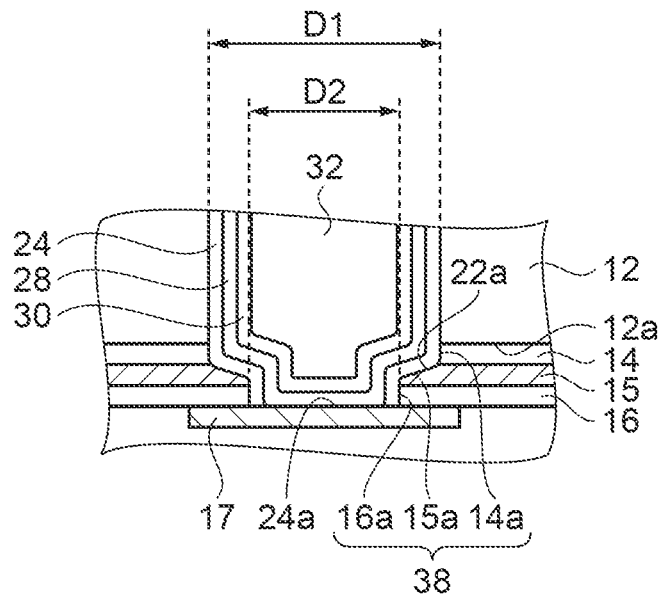

FIGS. 1A and 1B show a semiconductor device having a penetrating electrode according to the embodiment. FIG. 1A is a sectional view of the semiconductor device, and FIG. 1B is a partial detailed view of FIG. 1A.

A semiconductor device 11 of the embodiment includes a multilayered structure 10 as a substrate, an circuit element layer 50 as an circuit element, and a redistribution layer 34.

The multilayered structure 10 as the substrate of the embodiment has a base substrate 12, a first insulating layer 14 stacked on a front surface 12a as a first surface of the base substrate 12, a second insulating layer 15 stacked on the first insulating layer 14, a third insulating layer 16 stacked on the second insulating layer 15, and a pad electrode 17 stacked on the third insulating layer 16.

In the multilayered structure 10, a penetrating electrode 20 is formed.

The penetrating electrode 20 has a first recess part 22 penetrating from a rear surface 12b as a second surface of the base substrate 12 through the base substrate 12 and the first insulating layer 14 in a location opposed to the pad electrode 17, and a second recess part 26 penetrating the second insulating layer 15 and the third insulating layer 16 and reaching a location in which the pad electrode 17 is exposed in the center part of the second insulating layer 15 exposed in a bottom part 22a of the first recess part 22. The part including the first recess part 22 and the second recess part 26 corresponds to "hole" according to the invention.

Further, the penetrating electrode has a fourth insulating layer 24 stacked on an inner wall 22b of the first recess part 22, the bottom part 22a of the first recess part 22, and an inner wall 26a of the second recess part 26, and a conductor 32 formed to fill the first recess part 22 and the second recess part 26 or to be covered by the fourth insulating layer 24 and connecting to the pad electrode 17 exposed in the second recess part 26.

The base substrate 12 is formed using semiconductor of Si or the like, and has the circuit element layer (an integrated circuit, a sensor circuit, etc.) 50 to be described later on the front surface 12a and pluralities of circuit elements, wiring layers, and insulating layers stacked thereon. In the embodiment, the first insulating layer 14 formed using $SiO_2$, SiN, or the like is formed on the front surface 12a, and the second insulating layer 15 formed using AlO or the like is formed on the first insulating layer 14, and further, the third insulating layer 16 formed using $SiO_2$, SiN, or the like is formed on the second insulating layer 15. A plurality of the pad electrodes 17 formed using Al or the like are formed in predetermined locations on the third insulating layer 16, and function as part of the circuit element layer 50.

As described above, the multilayered structure 10 is formed by the base substrate 12, the first insulating layer 14, the pad electrodes 17, etc. and the pad electrodes 17 and the penetrating electrode 20 penetrating the first insulating layer 14, the second insulating layer 15, and the third insulating layer 16 electrically connect the redistribution layer 34 and the circuit element layer 50.

The circuit element layer 50 is formed on the front surface 12a of the base substrate 12, and the pad electrode 17 formed in the circuit element layer 50 is connected to the penetrating electrode 20 formed on the base substrate 12 and electrically drawn to the rear surface 12b of the base substrate 12 via the penetrating electrode 20. Further, the penetrating electrode 20 is connected to the redistribution layer 34 formed in correspondence with the electrode arrangement of an electronic device 56 on the rear surface 12b of the base substrate 12, and forms the semiconductor device 11.

Regarding the semiconductor device 11 and the electronic device 56, the redistribution layer 34 at the semiconductor device 11 side and a wiring layer 57 at the electronic device 56 side are connected by a connecting terminal 58.

For the connecting terminal 58, a low-melting-point metal such as solder or SnAg, a conducting metal such as Au, or a conducting adhesive agent, or the like is used. Note that, as the connecting terminal 58, a bump may be formed in the redistribution layer 34 or the wiring layer 57. In this case, it is preferable that a connecting electrode of SnAg or the like is formed in a wiring layer facing the bump formation side. FIG. 1A shows the case where a connecting electrode 35 of SnAg is formed at the redistribution layer 34 side as an example.

Accordingly, in the embodiment, the case where the front surface 12a of the base substrate 12 (the surface on which the circuit element layer 50 is formed) is directed toward the mounting side, the electronic device 56 is connected to the rear surface 12b, and the penetrating electrode 20 is applied to the pad electrodes 17 connecting to the above-described electronic device 56 will be described.

The first recess part 22 has a form of penetrating the base substrate 12 in the location opposed to the pad electrode 17 on the rear surface 12b of the base substrate 12, and further, penetrating the first insulating layer 14 and reaching the second insulating layer 15.

The second recess part 26 is formed to penetrate the second insulating layer 15 and the third insulating layer 16 and reach the pad electrode 17 in the center part of the bottom part 22a. Thereby, the first insulating layer 14 and the second insulating layer 15 have flange shapes. Therefore, according to the sectional view of FIGS. 1A and 1B, the first insulating layer 14 and the bottom part 22a have an L-shape.

Further, as shown in FIG. 1B, in the bottom part 22a of the first recess part 22, the second insulating layer 15 is formed to have a thickness thinner toward the center of the bottom part 22a, i.e., in an obtuse tapered shape.

Thereby, the contact area between the second insulating layer 15 and the fourth insulating layer 24 may be increased to improve the bonding strength. Further, the part in which the second insulating layer 15 is in contact with the second recess part 26 is formed to be thinner, and thus, the stress on the contact part between the pad electrode 17 and the conductor 32 due to the difference in thermal expansion and contraction between the second insulating layer 15 and the conductor 32 when thermal stress is applied may be reduced.

Furthermore, the first recess part 22 and the second recess part 26 respectively have circular inner walls in the plan view, and the diameter D1 of the first recess part 22 is made larger than the diameter D2 of the second recess part 26 and the second recess part 26 is formed at the center of the bottom part 22a of the first recess part 22.

Thereby, the fourth insulating layer 24 has a form bent in an L-shape in the part stacked on the second insulating layer 15, and the bonding area between the second insulating layer 15 and the fourth insulating layer 24 may be increased and the mechanical strength of the entire penetrating electrode 20 may be kept.

As described above, the first recess part 22 and the second recess part 26 covered by the fourth insulating layer 24 formed to include the first insulating layer 14, the second insulating layer 15, and the third insulating layer 16 are filled with a barrier layer 28, a seed layer 30, and the conductor 32.

The barrier layer 28 is formed by sputtering of a metal material of TiW or the like, for example, to prevent diffusion of the conductor 32 to the base substrate 12 (Si). The barrier layer 28 is stacked on the fourth insulating layer 24 on the rear surface 12b of the base substrate 12, the fourth insulating layer 24 covering the inner wall 22b and the bottom surface 22a of the first recess part 22, the fourth insulating layer 24 within the second recess part 26, and the pad electrode 17.

The seed layer 30 is formed to cover the barrier layer 28 using Cu or the like, and used for formation of the conductor 32 by plating.

The conductor 32 is formed by plating of Cu or the like to fill the first recess part 22 and the second recess part 26, or to cover like a film along their inner walls (the surfaces covering the barrier layer 28 and the seed layer 30). Further, the conductor 32 is also formed on the rear surface 12b of the base board 12 (the surfaces covering the barrier layer 28 and the seed layer 30), and the conductor 32 is electrically connected to the redistribution layer 34 formed at the rear surface 12b side of the base board 12. Thereby, the pad electrode 17 is electrically connected to the electronic device 56 via the barrier layer 28, the seed layer 30, the conductor 32, and the redistribution layer 34.

In the embodiment, the base board 12 is formed using Si. Further, a path 38 (L-shaped) includes a first contact interface 14a, a second contact interface 15a, and a third contact interface 16a as contact interfaces between the first insulating layer 14, the second insulating layer 15, and the third insulating layer 16 electrically connecting to the conductor 32 and the fourth insulating layer 24 is longer. The path 38 (L-shaped) extends from the pad electrode 17 to the base board 12.

Accordingly, even if the base board 12 is formed using semiconductor, the possibility of leakage of current from the conductor 32 to the base board 12 via the above-described path 38 is reduced. Therefore, even when the penetrating electrode 20 is applied to the semiconductor, the leakage current may be reduced and the reliability of the penetrating electrode 20 may be improved.

FIGS. 2A to 4C show a manufacturing process of the penetrating electrode and the semiconductor device of the embodiment. The manufacturing procedure of the penetrating electrode 20 and the semiconductor device 11 of the embodiment will be explained.

Figure 2A:
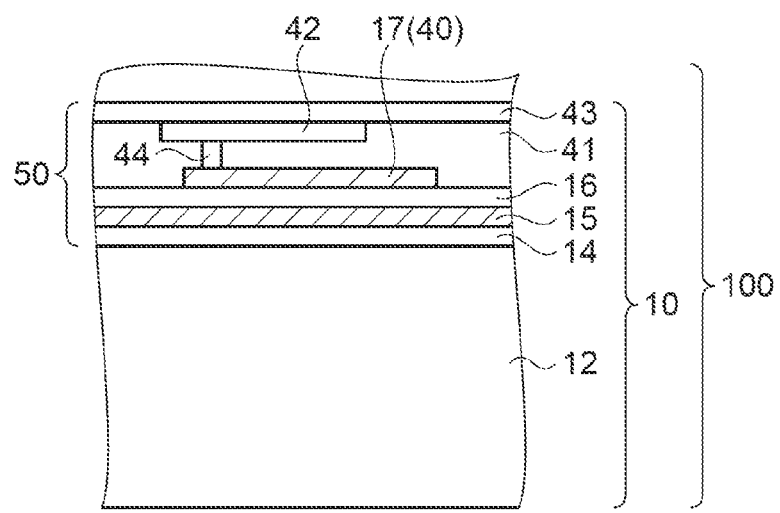
FIGS. 2A to 2C show a manufacturing process of the penetrating electrode in the embodiment.

First, as shown in FIG. 2A, a semiconductor substrate 100 on which the circuit element layer 50 is formed on one surface side of the base board 12 of the multilayered structure 10 is prepared. The circuit element layer 50 includes an integrated circuit, a sensor circuit, etc., and pluralities of circuit elements, wiring layers, and insulating layers stacked thereon. FIG. 2A shows the first insulating layer 14, the second insulating layer 15, the third insulating layer 16, an element wiring layer 40 (partially, the pad electrode 17), an insulating layer 41, a second element wiring layer 42, an insulating layer 43 are stacked in this order from the base board 12 side as an example. The element wiring layer 40 and the second element wiring layer 42 are connected by a penetrating electrode 44.

The case where an Si substrate is used as the semiconductor substrate 100 will be explained as an example.

Figure 2B:
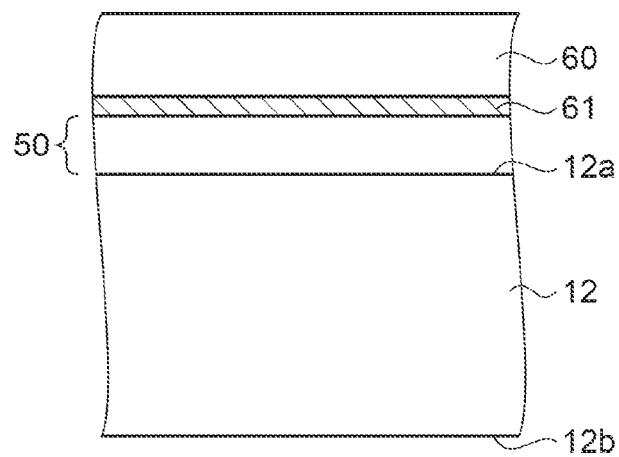

Second, as shown in FIG. 2B, a support glass 60 is bonded to the front surface 12a side of the base board 12, specifically, on the surface on which the circuit element layer 50 has been formed via an adhesive agent 61. The support glass 60 reinforces the base board 12 to be processed to be thinner, and thereby, prevents cracking at the step of the thinning processing and subsequent steps and secures fluidity. The support glass 60 may be heated at the subsequent steps, and desirably has a linear expansion coefficient close to that of the base board 12 (Si). For example, Pyrex (registered trademark), silica glass, or the like may be used.

Figure 2C:
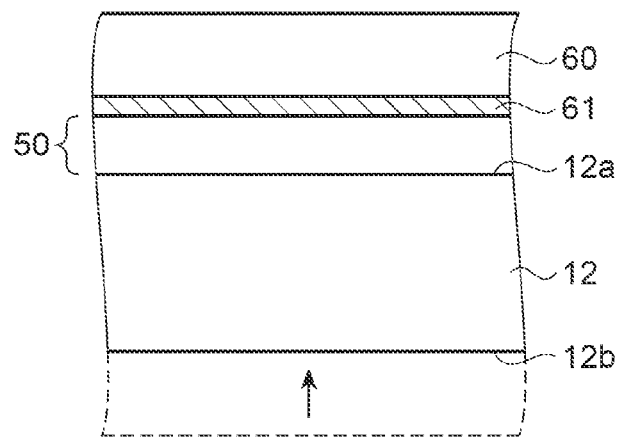

Third, as shown in FIG. 2C, the base board 12 is thinned. The exposed rear surface 12b of the base board 12 is thinned to have the thickness of about 50 μm, for example, by back grinding. Regarding the back-ground surface, the crushed layer of Si formed by back grinding may be removed by a method of dry etching, spin etching, polishing, or the like, for example.

Figure 3A:
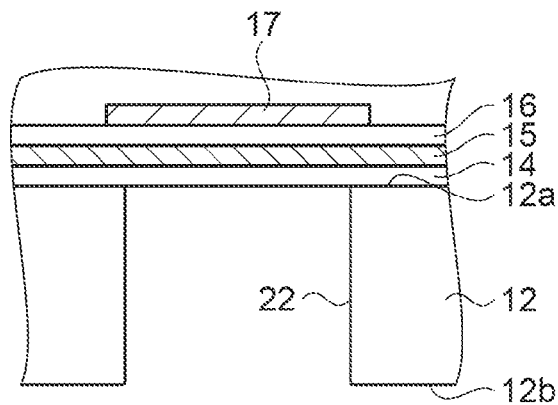
FIGS. 3A to 3C show the manufacturing process of the penetrating electrode in the embodiment.

Fourth, as shown in FIG. 3A, etching of the base board 12 is performed. The etching is performed from the location on the rear surface 12b of the base board 12 opposed to the pad electrode 17 toward the pad electrode 17, and a hole penetrating the base board 12 and reaching the first insulating layer 14 is formed. The first insulating layer 14 exposed by etching forms a circular through hole. The method of forming the hole includes a method by dry etching such as RIE or ICP and a forming method using laser. In dry etching as an example, the Bosh process of boring by alternatively repeating etching and deposition may be used. As gases in this case, $SF_6$, $O_2$ are used for etching, and $C_4F_8$, $O_2$ are used for deposition. As a method, the substrate is coated and protected by a resist or the like except the part in which the first recess part 22 is desired to be bored, dry etching processing is performed thereon, and then, the coating film of the resist or the like is removed.

Figure 3B:
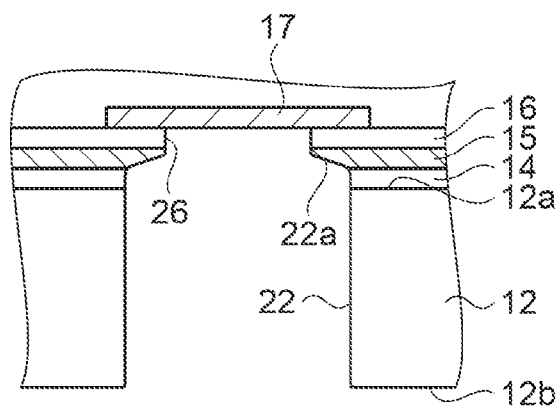

Fifth, as shown in FIG. 3B, the first recess part 22 is formed, and further, etching of the first insulating layer 14, the second insulating layer 15, and the third insulating layer 16 for formation of the second recess part 26 is performed. In the embodiment, an oxide film etcher is used, and $C_2F_6$, $CF_4$, $CHF_3$ is used as its process gas. Here, in the embodiment, $SiO_2$ is used for the first insulating layer 14, AlO is used for the second insulating layer 15, and $SiO_2$ is used for the third insulating layer 16.

Compared to the first insulating layer 14, the etching rate at dry etching of the second insulating layer 15 is slower, and, even when the first insulating layer 14 is etched, the second insulating layer 15 is etched only partly.

Further, because of characteristics of dry etching, the etching progresses from the center of the through hole, and thus, the first insulating layer 14 is etched from the part near the center of the through hole and the second insulating layer 15 is exposed in the part near the center of the through hole. When the etching is continued, the etching gradually progresses to the outer circumference of the through hole of the first insulating layer 14 and the second insulating layer 15. When the etching is further continued, the part near the center of the through hole of the second insulating layer 15 is etched, and the third insulating layer 16 is exposed. At this time, the etching at the inside of the through hole of the first insulating layer 14 has been finished. Further, the thickness of the second insulating layer 15 is thinner in the part near the center of the through hole than that of the outer circumference of the through hole, and thus, the bottom part 22a of the first recess part 22 may be formed to have the thickness thinner toward the center. Finally, the third insulating layer 16 is penetrated and the pad electrode 17 is exposed.

Figure 3C:
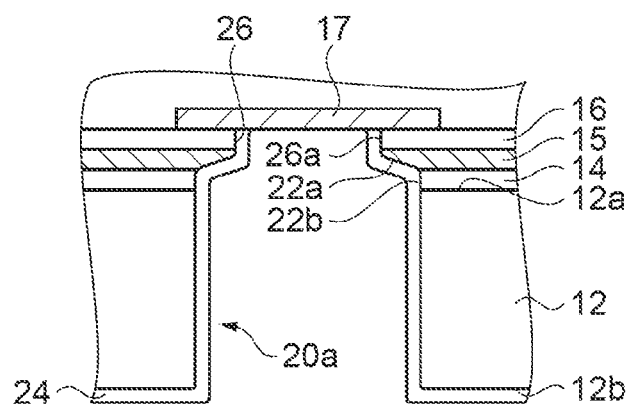

Sixth, as shown in FIG. 3C, the rear surface 12b of the base board 12, the inner wall 22b of the first recess part 22, the bottom part 22a of the first recess part 22, and the inner wall 26a of the second recess part 26 are covered by the fourth insulating layer 24, and thereby, a through hole 20a is formed. As the fourth insulating layer 24, an inorganic film of $SiO_2$, SiN, or the like is formed by the CVD method. The thickness is formed to be 3000 Å in the inner wall 22b and the bottom part 22a of the first recess part 22, and the inner wall 26a of the second recess part 26, and 2 to 3 μm on the rear surface 12b of the base board 12. Note that, in the CVD method, the inorganic film is also formed on the exposed pad electrode 17, and thus, the fourth insulating layer 24 on the pad electrode 17 within the through hole 20a is removed by dry etching and the pad electrode 17 is exposed. The insulating layer removing step is performed using the oxide film etcher after resist-protection of the part in which removal of the fourth insulating layer 24 is not desired. As the process gas, $C_2F_6$, $CF_4$, $CHF_3$, or the like is used.

Figure 4A:
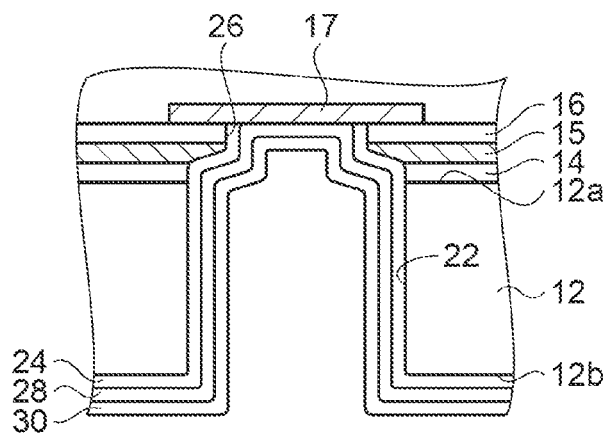
FIGS. 4A to 4C show the manufacturing process of the penetrating electrode in the embodiment.

Seventh, as shown in FIG. 4A, the barrier layer 28 and the seed layer 30 are formed on the fourth insulating layer 24 of the first recess part 22, the second recess part 26, and the rear surface 12b of the base board 12 (see FIG. 1B). As the barrier layer 28, Ti, TiW, TiN, or the like may be used. Further, subsequently, the seed layer 30 for the next plating step is formed. As the material of the seed layer 30, for example, Cu may be used.

These steps may be formed by sputtering and CVD. It is preferable that the thickness of the barrier layer 28 is about 100 nm, the thickness of the seed layer 30 is about 300 nm. Note that, for the purpose of removing a natural oxide film in the exposed part of the pad electrode 17 formed using Al, reverse sputtering may be performed before formation of the barrier layer 28. The amount of processing of the reverse sputtering may be such that etching is performed to about 300 nm in $SiO_2$, for example.

Figure 4B:
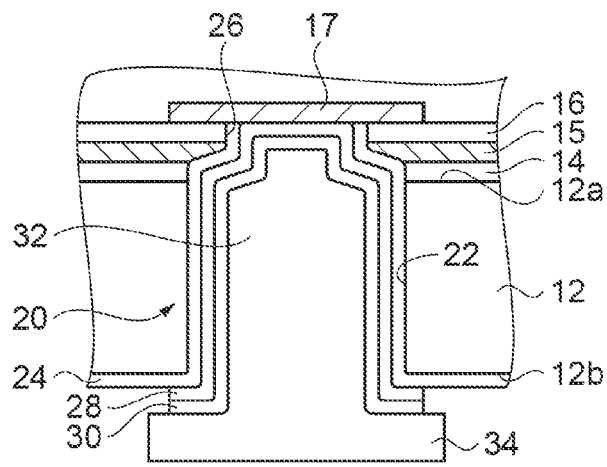

Eighth, as shown in FIG. 4B, the penetrating electrode 20 and the redistribution layer 34 are formed using conductor. When the first recess part 22 and the second recess part 26 are filled with the conductor 32, a resist for plating (not shown) is formed. In this case, the resist (not shown) is formed on the penetrating electrode 20 and the rear surface 12b of the base board 12, and the location in which the redistribution layer 34 connecting to the penetrating electrode 20 is to be formed is opened. First, the first recess part 22 and the second recess part 26 are plated and filled using the conductor 32, and subsequently, plating of the redistribution layer 34 using conductor is performed.

Note that the case where filling of the first recess part 22 and the second recess part 26 and the formation of the wiring of the rear surface 12b etc. are formed at the series of plating steps has been shown, however, they may be formed at separate steps. The thickness of the redistribution layer 34 may be about 6 μm.

After the above-described plating steps are finished, with the rear surface 12b of the base board 12 exposed, the remaining barrier 28 and seed layer 30 are removed by etching.

Figure 4C:
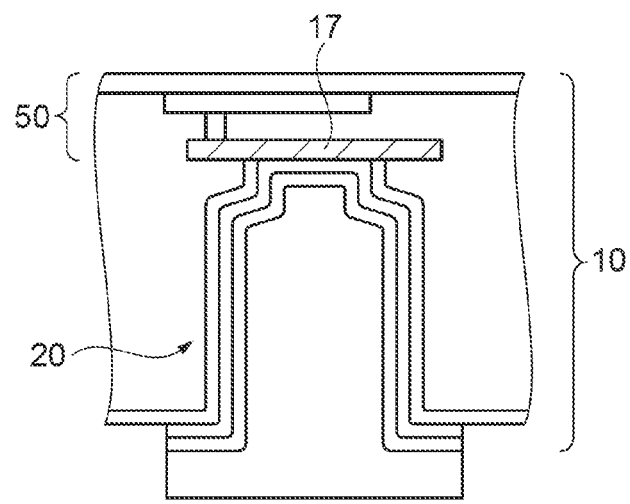

Finally, as shown in FIG. 4C, the base board 12 is irradiated with laser from the side on which the support glass 60 is bonded and the adhesive agent 61 (FIG. 2B) for bonding the support glass 60 is melted, the support glass 60 is separated, and the integrated circuit, the sensor circuit, etc. of the circuit element layer 50 are exposed. Thereby, the multilayered structure 10 (semiconductor device 11) having the penetrating electrode 20 of the embodiment may be formed.

The inventors have confirmed that, as result of a reliability test using a temperature cycling test on the multilayered structure 10 (semiconductor device 11) having the penetrating electrode 20 created using the above-described process, defects due to separation in the insulating layer parts between the pad electrode 17 and the penetrating electrode 20 or the like are not caused.

Note that, obviously, a circuit arrangement 200 in which the electronic device 56 is connected to the semiconductor device 11 containing the multilayered structure 10 having the configuration shown in FIG. 1A may be formed.

Embodiment 2

Next, a semiconductor device according to embodiment 2 will be explained. The configuration of a semiconductor device 110 of the embodiment 2 is partially the same as the configuration of the semiconductor device 11 of the above-described embodiment 1. In the embodiment 1, the diameters of the second recess part 26 are the same in the second insulating layer 15 and the third insulating layer 16, and, in the embodiment 2, the diameter of the opening part of the third insulating layer 16 (the diameter D3 in FIG. 5B) is smaller than that of the second insulating layer 15 (the diameter D2 in FIG. 5B). Accordingly, the explanation will be centered on the difference from the embodiment 1 with the same signs for the same parts as those of the embodiment 1.

Figure 5A:
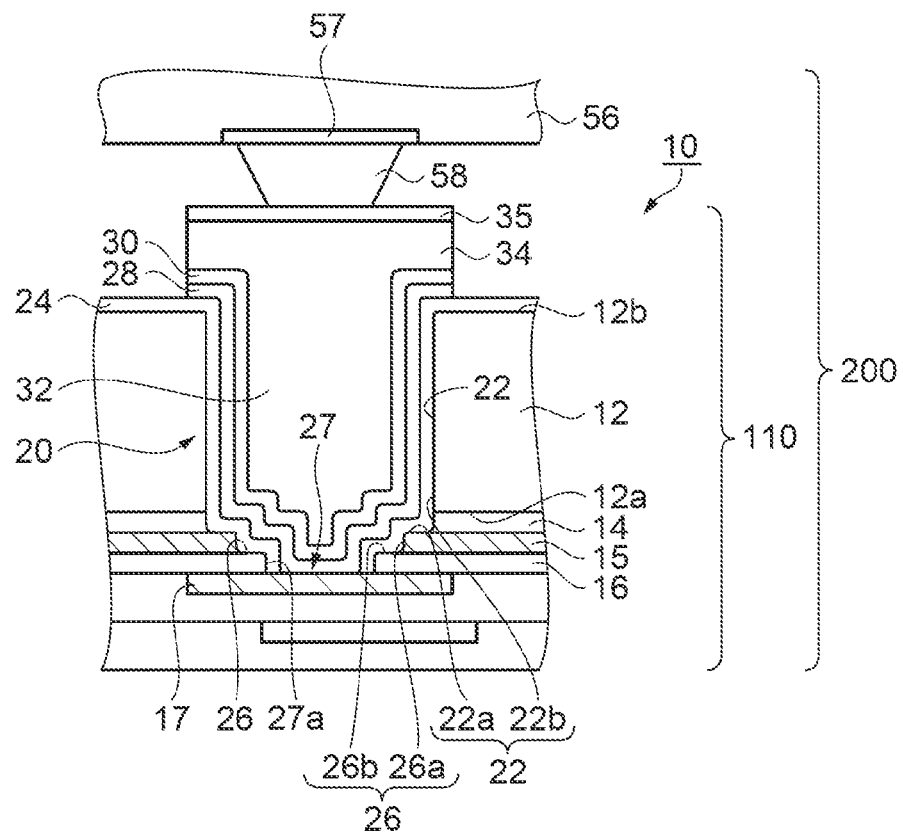
FIGS. 5A and 5B are schematic views of a semiconductor device having a penetrating electrode of an embodiment.
Figure 5B:
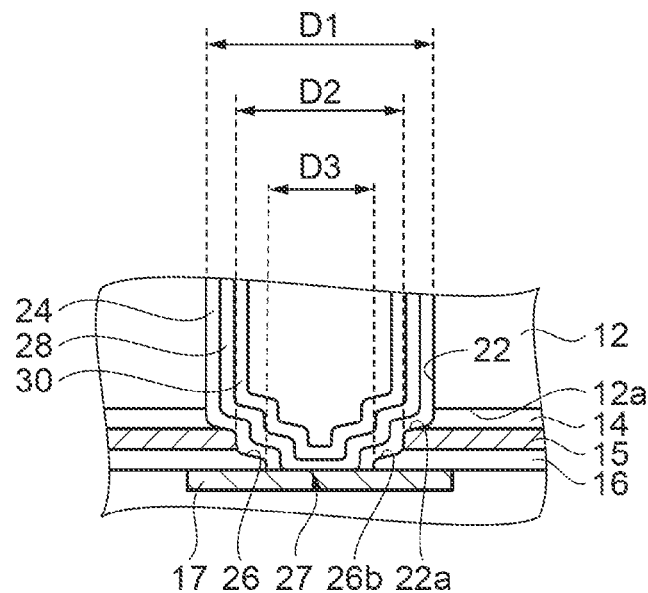

FIGS. 5A and 5B show the semiconductor device 110 having the penetrating electrode according to the embodiment 2. FIG. 5A is a sectional view of the semiconductor device, and FIG. 5B is a partial detail view of FIG. 5A.

The penetrating electrode 20 of the embodiment 2 is a penetrating electrode 20 formed on a multilayered structure 10 having a base board 12, a first insulating layer 14, stacked on a front surface 12a of the base board 12, a second insulating layer 15 stacked on the first insulating layer 14, a third insulating layer 16 stacked on the second insulating layer 15, a pad electrode 17 stacked on the third insulating layer 16.

The penetrating electrode 20 has a first recess part 22 formed in the location opposed to the pad electrode 17 on a rear surface 12b of the base board 12, penetrating the base board 12, and further penetrating the first insulating layer 14, a second recess part 26 penetrating the second insulating layer 15 in the center part of the second insulating layer 15 exposed in a bottom part 22a of the first recess part 22, and a third recess part 27 penetrating the third insulating layer 16 and reaching the location in which the pad electrode 17 is exposed in the center part of the third insulating layer 16 exposed in a bottom part 26b of the second recess part 26.

The penetrating electrode has a fourth insulating layer 24 stacked on the second insulating layer exposed in an inner wall 22b of the first recess part 22 and the bottom part 22a of the first recess part 22, the third insulating layer 16 penetrating the second insulating layer 15 and exposed in the bottom part 26b of the second recess part 26, and an inner wall 27a of the third recess part 27 penetrating the third insulating layer 16 and reaching the location in which the pad electrode 17 is exposed, and a conductor 32 formed to fill the first recess part 22, the second recess part 26, and the third recess part 27, or to cover the inner walls 22b, 26a, 27a and the bottom parts 22a, 26b of the first recess part 22, the second recess part 26, and the third recess part 27 and connecting to the pad electrode 17 exposed in the third recess part 27.

Further, as shown in FIG. 5B, in the bottom part 22a of the first recess part 22, the second insulating layer 15 is formed to have a thickness thinner toward the center of the bottom part 22a, and further, in the bottom part 26b of the second recess part 26, the bottom part 26b covered by the fourth insulating layer 24 of the third insulating layer 16 is formed to have a thickness thinner toward the center of the second recess part 26, i.e., in an obtuse tapered shape.

Thereby, the contact areas between the second insulating layer 15 and the third insulating layer 16 and the fourth insulating layer 24 may be increased to improve the bonding strength. Further, the parts of the second insulating layer 15 and the third insulating layer 16 covered by the fourth insulating layer 24 (the bottom part 22a, the bottom part 26b) are formed to be thinner, and thereby, the stress on the contact part between the pad electrode 17 and the conductor 32 due to the difference in thermal expansion and contraction between the second insulating layer 15 and the third insulating layer 16 and the conductor 32 when thermal stress is applied may be reduced.

The configuration of the above-described semiconductor device 110 including the multilayered structure 10 according to the embodiment 2 is the same as that of the embodiment 1.

The inventors have confirmed that, as a result of reliability test using a temperature cycling test on the multilayered structure 10 (semiconductor device 110) having the penetrating electrode 20 formed in the embodiment 2, defects due to separation in the insulating layer parts between the pad electrode 17 and the penetrating electrode 20 or the like are not caused. Note that, obviously, a circuit arrangement 200 in which an electronic device is connected to the semiconductor device 110 containing the multilayered structure 10 having the configuration shown in FIG. 5A may be formed.

Finally, an electronic apparatus having the above-described semiconductor device 11 or circuit arrangement 200 will be explained.

Figure 6:
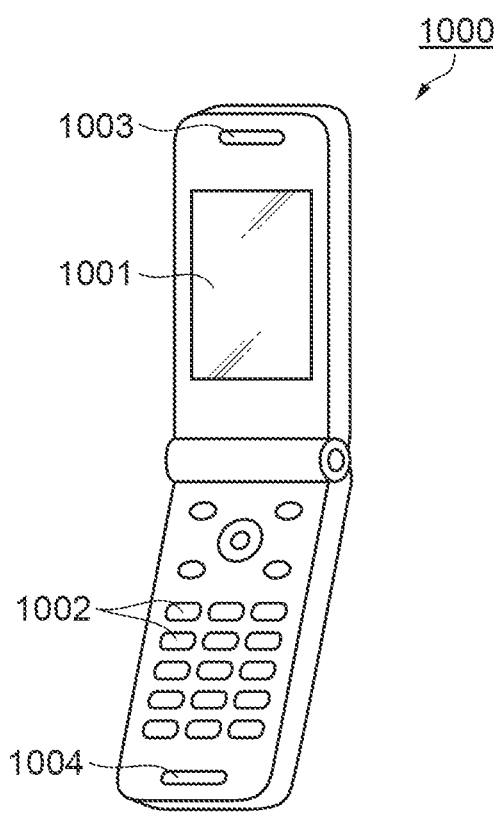
FIG. 6 is a schematic view of a penetrating electrode according to related art.

FIG. 6 is a perspective view of a cellular phone 1000 shown as an example of the electronic apparatus. The cellular phone 1000 includes a display part 1001, a plurality of operation buttons 1002, an ear piece 1003, and a mouthpiece 1004. Inside the cellular phone 1000, the above-described semiconductor device 11, 110 or the circuit arrangement 200 is provided. Therefore, the cellular phone 1000 employs the above-described semiconductor device 11, 110 or circuit arrangement 200 having high reliability and high integration, thereby, reduction in size and weight may be realized, and further, the employment may contribute to higher functionality.

Note that, the electronic apparatus to which the invention is applied is not limited to the above-described cellular phone 1000.

For example, when the circuit arrangement 200 includes an inertial sensor, it may be applied to a navigation system, an electronic camera, an in-car camera, a motion sensor device, a game machine, a robotics device, or the like.

Further, when the circuit arrangement 200 includes a physical quantity sensor, it may be applied to an inclinometer, a weight/gravity meter, a flow meter, or the like, and particularly suitable for a portable electronic apparatus requiring downsizing and higher density.

The entire disclosure of Japanese Patent Application No. 2012-150345 filed on Jul. 4, 2012 is expressly incorporated by reference herein.

What is claimed is:

1. A substrate comprising:
a base board;
three insulating layers stacked on the base board;
a pad electrode provided on the insulating layer in a location farthest from the base board of the three insulating layers; and
a hole formed to penetrate the base board and the three insulating layers and reaching the pad electrode,
wherein a diameter of the hole in the insulating layer in a location closest to the base board of the three insulating layers is larger than a diameter of the hole in the insulating layer in the location farthest from the base board,
the insulating layer in an intermediate location of the three insulating layers is formed using a metal oxide, and
the insulating layer in the location closest to the base board is formed using a semiconductor oxide or a semiconductor nitride.

2. The substrate according to claim 1, wherein the insulating layer in the intermediate location of the three insulating layers is formed at a slower etching rate in dry etching than that for the insulating layer in the location closest to the base board.

* * * * *